United States Patent
Tsai et al.

(10) Patent No.: US 6,224,737 B1
(45) Date of Patent: May 1, 2001

(54) METHOD FOR IMPROVEMENT OF GAP FILLING CAPABILITY OF ELECTROCHEMICAL DEPOSITION OF COPPER

(75) Inventors: Ming-Hsing Tsai, Taipei; Wen-Jye Tsai, Hsin-chu; Shau-Lin Shue, Hsinchu; Chen-Hua Yu, Hsin-chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/377,540

(22) Filed: Aug. 19, 1999

(51) Int. Cl.$^7$ .................................................. C25D 5/02
(52) U.S. Cl. .............................................. 205/123
(58) Field of Search .................... 205/123, 118, 205/184

(56) References Cited

U.S. PATENT DOCUMENTS

| | | | |
|---|---|---|---|
| 4,169,018 | 9/1979 | Berdan et al. | 204/13 |
| 5,256,274 | * 10/1993 | Poris | 205/123 |
| 5,472,592 | 12/1995 | Lowery | 205/137 |
| 5,662,788 | * 9/1997 | Sandhu et al. | 205/87 |
| 5,723,387 | 3/1998 | Chen | 438/692 |
| 5,821,168 | * 10/1998 | Jain | 438/692 |
| 5,968,333 | * 10/1999 | Nogami et al. | 205/184 |
| 5,972,192 | * 10/1999 | Dubin et al. | 205/101 |
| 6,048,445 | * 4/2000 | Brain | 205/118 |
| 6,071,814 | * 6/2000 | Jang | 438/687 |
| 6,168,704 | * 1/2001 | Brown et al. | 205/118 |

* cited by examiner

Primary Examiner—Kathryn Gorgos
Assistant Examiner—Erica Smith-Hicks
(74) Attorney, Agent, or Firm—George O. Saile; Stephen B. Ackerman; Stephan Stanton

(57) ABSTRACT

A semiconductor structure having a trench formed therein is provided. The semiconductor structure may be a substrate with an overlying interlevel metal dielectric layer having the trench. A voltage is applied to the trenched semiconductor inducing a bias field where there is a first field proximate the trench bottom and a second field, greater than the first field, proximate the trench's upper side walls and the semiconductor upper surface proximate the trench. The semiconductor structure is placed into an electroplating solution containing a predetermined concentration of brighteners and levelers. Because of the induced bias field, the brightener concentration is greater proximate the trench bottom and the leveler concentration is greater the trench's upper side walls and the semiconductor upper surface proximate the trench. A copper layer having a predetermined thickness is then electrolytically deposited within the trench in a "bottom-up" fashion and blanket fills the upper surface of the semiconductor structure. The structure may then be planarized by CMP to create a planarized copper filled trench.

21 Claims, 2 Drawing Sheets

METHOD FOR IMPROVEMENT OF GAP FILLING CAPABILITY OF ELECTROCHEMICAL DEPOSITION OF COPPER

FIELD OF THE INVENTION

The present invention relates generally to methods for electroplating copper in damascene integrated circuit trenches or vias to form conductive metal inter-connections between selected semiconductor devices on the integrated circuit.

BACKGROUND OF THE INVENTION

Copper (Cu) is one of the promising conductors for next generation ultra-large scale integration (ULSI) metallization due to Cu's low resistivity and high electomigration resistance. Successful implementation of copper metallization requires a suitable means of filling trenches and vias with Cu. Fast depositing and good gap filling have been achieved using electrochemical deposition (ECD) techniques followed by chemical mechanical polishing (CMP) for planarization. However the major drawback of these ECD techniques is limited by additives (including polyethylene glycol (PEG), polyethylene imine (PEI), or polyvinylalcohol) mass transfer, which results in poor gap filling in high aspect ratio, i.e. relatively deep, narrow width trenches damascene structures. For such high aspect ratio trenches, Cu deposition closes off the upper portion, or throat, of the trench, or via, before the trench is completely filled resulting in voids or seams in the Cu filled trench which adversely affects performance especially in multiple layers of stacked such Cu filled trenches.

"Suppressing" and "brightening" agents are two types of organic additives commonly used in electroplating along with chloride. Suppressors, also known as "carriers" or "levelers" depending on specific functionality, are macro-molecule deposition inhibitors that tend to adsorb over the wafer or semiconductor substrate and reduce local deposition rates, while brighteners are organic molecules that tend to improve the specularity (or reflectivity—i.e. smooth films appear bright while rough films appear dark or hazy) of the deposit by reducing both surface roughness and grain-size variation. Brighteners interact with suppressors and compete for surface adsorption sites and locally accelerating deposition rates. For acid copper electroplating, most commercial electroplating mixtures use three organic components, i.e.: brighteners; suppressors which comprise levelers and carriers; and chloride ions which adsorb at the cathode during plating.

The general chemical characteristics of brighteners are water soluble salts of organic acids containing a mercapto or thiol functional group. A typical example would be:

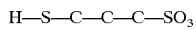

present at 1 to 10 ppm concentration. Brighteners adsorbs strongly on Cu metal during plating and participates in the charge transfer reaction. They determine Cu growth characteristics with major impact on ductility, smoothness, and hardness. Brighteners are the least stable of all additive components and are subject to oxidation by air (oxygen), electrochemical oxidation at the anode, and catalytic decompositon at the Cu surface. By-products of brighteners are often detrimental to deposit properties and control of brighteners during electroplating is relatively important and is the subject of most acid-Cu additive control.

The general chemical characteristics of levelers are a high molecular weight monomer or polymer with both sulfonic acid and nitrogen containing functional groups and are usually present at 10 to 100 ppm concentrations. The nitrogen containing groups are protonated in acid solution and adsorb strongly on Cu to inhibit plating. The exact chemical composition varies by supplier and application requirements. Levelers reduce Cu growth at edges and protrusions to yield a smoother final surface. They increase polarization resistance at high growth areas by either: inhibiting growth proportional to mass transfer at localized sites; or adsorbing more selectively at more cathodic (fast growing) sites. Levelers are relatively stable compared to brighteners.

The general chemical characteristics of carriers are oxygen containing polymers containing no sulfur or nitrogen groups. Typical examples are polyethylene glycol or polyoxyethylene glycol of from 3000 to 8000 molecular weight. Carriers adsorb during Cu plating to form a relatively thick monolayer film at the cathode and moderately polarize Cu deposition by preventing diffusion of $Cu^{2+}$ ions to the surface. A carrier alone, or with Cl$^-$, yields good thickness distributions but poor fill and deposit properties. Carriers effect on plating is stable over a wide range of concentrations, from 10 to 1,000 ppm, and molecular weights from 800–1,000. Carriers are gradually broken into lower molecular weight fragments at both the anode and the cathode and tend to lose polarization effectiveness below a molecular weight of 750.

Chloride, as HCl, is an additive for nearly all commercial additive electroplating systems and is present at bath concentrations of 30 to 100 ppm. It adsorbs at both the cathode and anode and modifies adsorption properties of the carrier to influence thickness distribution. It accumulates in anode film and increases anode dissolution kinetics. Chloride does not decompose or complex irreversibly with other bath components and the bath chloride concentrations may shift inversely with the anode film chloride level.

For ultralarge-scale integration (ULSI) interconnect applications, the composition and concentrations of brighteners and suppressors are selected such that brightener surface concentration dominates on the interior surfaces of trenches and vias. Local deposition rates are thus supressed at the top of topographical features relative to the insides, leading to the desired "bottom-up" deposition and void-free metal filing of the trenches and vias. In order to have sufficient Cu to cover the step height and to improve planarity before CMP, the thickness of the Cu layer has to be increased. However, increased thickness of the Cu layer leads to poor uniformity and lower CMP throughput.

U.S. Pat. No. 5,662,788 to Sandhu et al. describes a method for forming a metallization layer which uses a single electrodeposition step to form both the metallization layer and fill the contact vias. Metal ions are electrodeposited by applying a bi-polar modulated voltage having a positive duty cycle and a negative duty cycle to first and second layers of material and the solution. The voltage and surface potentials are selected such that the metal ions are deposited on the portions of the second layer that define the layout of the metallization layer and the contact vias.

U.S. Pat. No. 5,723,387 to Chen describes a self contained unit for forming copper interconnection structures on semiconductor (SC) substrates. The unit has an enclosed chamber with a plurality of apparatus for performing wet processes and provides a way of reducing the number of times the wafer is transferred between the wet process steps that require less environmental cleanliness and dry, very clean process steps.

U.S. Pat. No. 5,821,168 to Jain describes a process for forming a semiconductor device in which an insulating layer is nitrided and then covered by a thin adhesion layer before depositing a composite copper layer. This process eliminates the need for a separate diffusion barrier since a portion of the insulating layer is converted to form a diffusion barrier film and the adhesion layer reacts with the interconnect material resulting in strong adhesion between the composite copper layer and the diffusion barrier film formed on the insulating layer. After a copper seed layer is deposited by physical vapor deposition over the adhesion layer using a collimated sputtering chamber, the substrate is taken to an electroplating system where 6,000–15,000 Å of copper is plated over the copper seed layer forming a composite copper layer with the copper seed layer indistinguishable from the plated copper layer. CMP then removes the composite copper layer overlying the uppermost surface of the insulating layer.

U.S. Pat. No. 5,472,592 to Lowery describes an apparatus for electrolytic plating of a substrate within an electrolytic bath. The apparatus includes a tank structure for containing an electrolyte and an anode. A shaft is rotatably mounted within the tank to rotate about a first axis. An arm is mounted on the shaft, and a fixture for receiving the substrate is rotatably mounted on the arm to rotate about a second axis, so that the substrate is both revolved about the first axis and rotated about the second axis. Electrical contact is maintained between the rotating substrate and a stationary power supply for plating.

U.S. Pat. No. 4,169,018 to Berdan et al. describes a copper electroplating method typically used on a carrier such as aluminum. The carrier surface is pretreated and copper foil is electroplated unto the treated carrier surface in a single-step process comprising an acidic plating bath containing copper, nitrate and fluoride ions which can be operated at a single-current density.

SUMMARY OF THE INVENTION

Accordingly, it is an object of the present invention to improve the electrochemical copper deposition bottom-up gap filling of trenches or vias.

Another object of the present invention is to form a copper interconnect in an integrated circuit structure using a multiple step copper electroplating process that avoids formation of a void or seems in the via interconnect.

A further object of the present invention is to form a copper interconnect in an integrated circuit structure using a multiple step copper electroplating process that improves throwing power T, i.e. the ratio of growth rate in the trench to growth rate on the surface (T=growth rate in hole/growth rate on surface>1), by including a hot start step by turning on the voltage source before placing the wafer into the electrodeposition solution.

Other objects and advantages of the present invention will become apparent from the following detailed description thereof, which includes the best mode contemplated for practicing the invention.

It has now been discovered that the above and other objects of the present invention may be accomplished in the following manner. Specifically, a semiconductor structure having a trench formed therein is provided. The semiconductor structure may be a substrate with an overlying interlevel metal dielectric layer having the trench. A voltage is applied to the trenched semiconductor inducing a bias voltage where there is a first voltage proximate the trench bottom and a second voltage, greater than the first voltage, proximate the trench's upper side walls and the semiconductor upper surface proximate the trench. The semiconductor structure is placed into an electroplating solution containing a predetermined concentration of brighteners and levelers. Because of the induced bias voltage, the brightener concentration is greater proximate the trench bottom and the leveler concentration is greater the trench's upper side walls and the semiconductor upper surface proximate the trench. A copper layer having a predetermined thickness is then electrolytically deposited within the trench in a "bottom-up" fashion and blanket fills the upper surface of the semiconductor structure. The structure may then be planarized by CMP to create a planarized copper filled trench.

BRIEF DESCRIPTION OF THE DRAWINGS

The features and advantages of the method according to the present invention and further details of that method in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
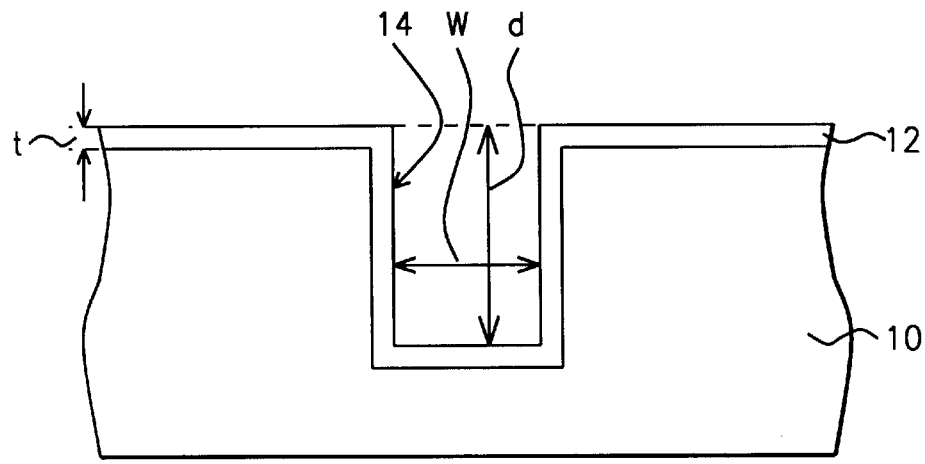
FIGS. 1 to 5 show a series of schematic cross-sectional diagrams illustrating the results of progressive stages in electroplating copper, within an intermetal dielectric layer, for example, employed in integrated circuit fabrication, in accordance with a preferred embodiment of the method of the present invention.

Accordingly, as shown in FIG. 1, a semiconductor structure 10 has trenches 14 that may be formed therein by various conventional methods and equipment well known in the art. Trench 14 has a depth, d, from about 2000 to 15,000 Å; a width, w, of from about 1000 to 30,000 Å; and an aspect ratio from about 0.1 to 10.

Briefly, the invention comprises:

placing the wafer in an electroplating tool;

applying a bias voltage to the wafer, the "hot start;"

immersing the wafer into an electroplating solution;

applying a normal plating bias to the wafer and plating copper onto the wafer; then removing the wafer from the electroplating bath and the electroplating tool.

It is noted that trenches 14 may be holes, vias or any other like structure and various layers, not shown, may comprise semiconductor structure 10. These various layers may include lower levels of metallization, gate electrodes, isolation regions, capacitors or other features. The structure surface, i.e. the uppermost exposed layer over semiconductor structure 10, may be an overlying interlevel metal dielectric (IMD) layer. The subsequently formed plug 20a may contact an underlying conductive structure (not shown) such as a metal or polysilicon line.

Figure 6:
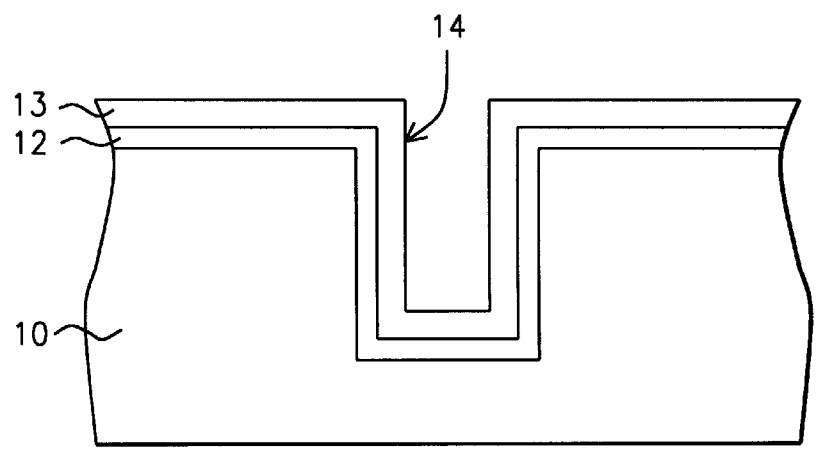
FIG. 6 is a schematic cross-sectional diagram illustrating the deposition of a barrier layer and overlying copper seed layer in a trench, within an intermetal dielectric layer, for example, employed in integrated circuit fabrication, in accordance with a preferred embodiment of the method of the present invention.

The trenched semiconductor structure 10 is prepared for copper electroplating which may include the addition of a diffusion barrier layer, an adhesion layer, and/or a metallization layer generally shown as layer 12 having a thickness, t, from about 50 to 500 Å and more preferably 250 Å. Layer 12 may, for example, consist of a thin conductive barrier layer such as titanium nitride (TiN), tantalum nitride (TaN), or nitrided titanium-tungsten blanket deposited by one of several techniques including sputtering or low pressure chemical vapor deposition (LPCVD). Most preferably, as shown in FIG. 6, layer 12 is composed of an about 50 to 500 Å and more preferably 250 Å thick TaN layer under a copper (Cu) seed layer 13 that is from about 500 to 2500 Å thick.

The optional copper seed layer (over the preferable TaN layer), has a thickness of from about 500 to 5,000 Å, and more preferably 2,500 Å, and may be deposited by physical vapor deposition (PVD), and more preferably by sputtering or ionized metal plasma (IMP) sputtering, on trenched semiconductor structure 10 before application of the bias voltage and also lining trench bottom 16 and side walls including upper side walls 18.

Figure 2:
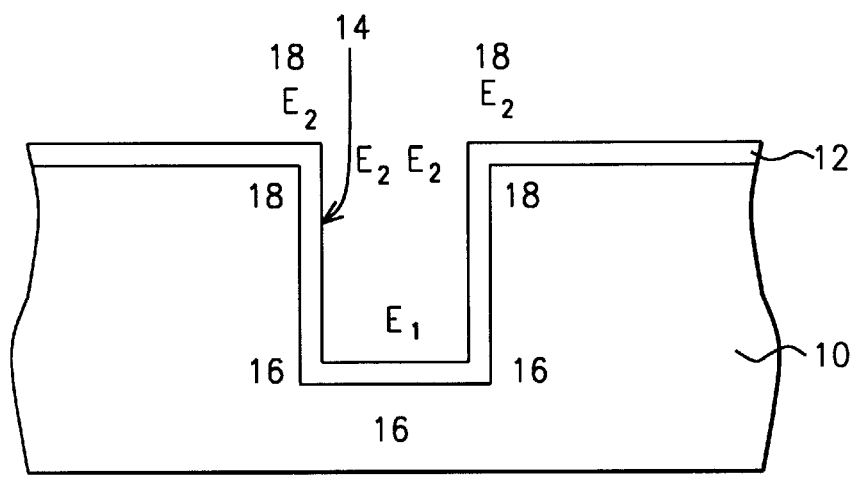
Figure 3:
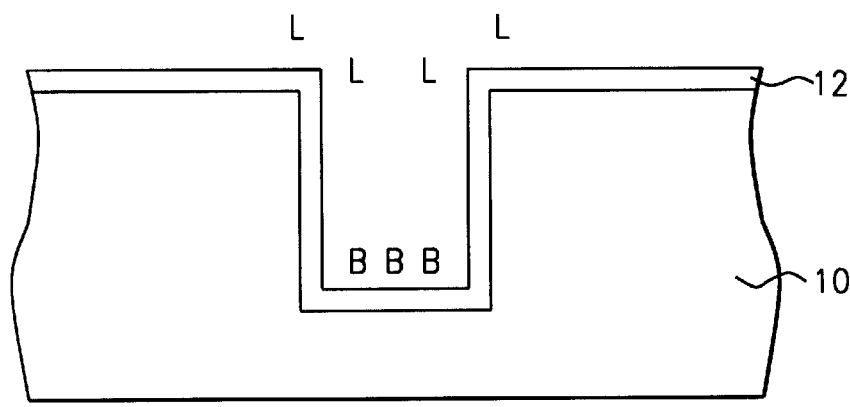

As shown in FIG. 2, a "hot start" step is achieved after placing the wafer into a conventional plating tool but before placing the wafer into the plating bath by applying a voltage from 0.3 to 2.2 volts for a period of from about 0.1 to 5 seconds, and more preferably 0.5 to 2.0 volts for a period of from about 60 to 300 seconds to the trenched semiconductor structure inducing a first field (electrical field) E1 proximate trench bottom 16, and a second field E2, greater than first field E1, proximate trench upper opposing side walls 18 and semiconductor structure upper surface 18 proximate trench 14. Since second field (electrical field) E2 is greater than first field E1, a bias voltage/field is achieved. this hot start step improves the throwing power.

Figure 4:
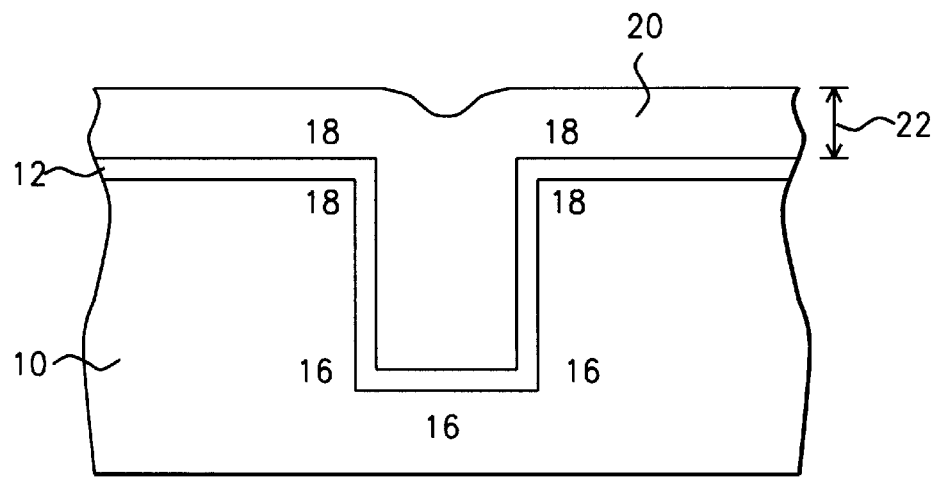

Referring now to FIG. 4, semiconductor structure 10 is placed into an electroplating solution that includes brighteners B at predetermined concentrations, and levelers L at predetermined concentrations. The ratio of brighteners:levelers to form Cu electroplated layer 20 is from about 10:1 to 1:1 and more preferably 4:1. The bias voltage/field is then changed into normal plating condition after the wafer is placed into the bath. (The normal bias voltage for the copper electroplating is from about 0.1 to 2 volts.) Because of the bias voltage/field about trench 14, brighteners B adsorb at 16, proximate lower field E1, so that the concentration of brighteners B is greater proximate trench bottom 16 and levelers L adsorb at 18, proximate higher field E2, so that the concentration of levelers L is greater proximate trench upper opposing side walls 18 and said semiconductor structure upper surface 18 proximate trench 14 as shown in FIG. 2.

The "hot start" bias voltage/field enhances the field difference at the bottom of trench 14 and the top comers of trench 14. Copper is then electroplated onto semiconductor structure 10 filling trench 14 and blanketing the semiconductor structure surface to form a Cu electroplated layer 20 under the following electroplating parameters:

a pH from about 0.01 to about 3 and more preferably 0.1;

a current density from about 0.3 to about 2.8 and more preferably 1.5 A/dm$^2$; (where "A" is amperes and 1 dm$^2$=100 cm$^2$)

a temperature from about 10 to about 40 and more preferably 25 degrees C.;

Composition of the electrolyte solution, plus or minus 5%:

Cu: 25 g/l

CuSO$_4$: 60 g/l

H$_2$SO$_4$: 200 g/l

Cl: 70 ppm

Levelers used: polyamines

Carriers used: polyethers glacial

Brightening agent used: disulfides

Equipment used: conventional

Since the brightener B concentration dominates proximate bottom 16 of trench 14, and the leveler L concentration dominates proximate the upper corners of trench 14 and is used as a suppressor to reduce growth rate at the throat of trench 14, the desired "bottom-up" deposition and void-free metal filing of trenches 14 is achieved.

Figure 5:
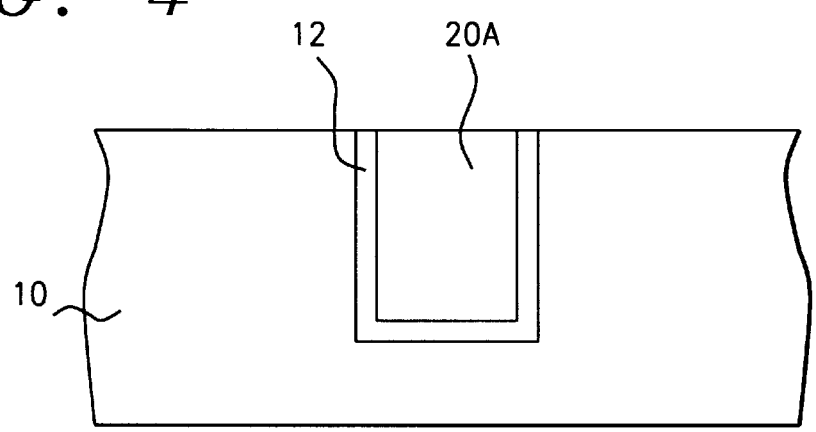

Referring again to FIG. 4, Cu layer 20 has a thickness 22 from about 2,000 to 16,000 Å and more preferably 8,000 Å. Cu layer 20 may then be planarized, preferably by conventional chemical-mechanical polishing (CMP), to form a planarized copper filled trench or via 20a, e.g. plug 20a (as shown in FIG. 5).

While particular embodiments of the present invention have been illustrated and described, it is not intended to limit the invention, except as defined by the following claims.

We claim:

1. A method for electroplating copper in a trench, the steps comprising:

providing a semiconductor structure and a trench formed therein; said semiconductor structure having an upper surface, and said trench having a bottom, and lower and upper opposing side walls and further having a predetermined depth and width;

applying a voltage to said trenched semiconductor structure inducing a first field proximate said trench bottom, and a second field proximate said trench upper opposing side walls and said semiconductor structure upper surface proximate said trench; said second field being greater than said first field creating a bias field;

immersing said semiconductor structure into an electroplating solution; said electroplating solution including a predetermined concentration of brighteners and a predetermined concentration of levelers; the concentration of said brighteners being greater proximate said trench bottom and the concentration of said levelers being greater proximate said trench upper opposing side walls and said semiconductor structure upper surface proximate said trench; and depositing a copper layer having a predetermined thickness within said trench and blanket filling said semiconductor structure upper surface.

2. The method of claim 1, further including the step of planarizing said copper layer to form a planarized copper filled trench.

3. The method of claim 1, further including the step of planarizing said copper layer to form a planarized copper filled trench, wherein said semiconductor structure is a substrate with an overlying interlevel metal dielectric layer.

4. The method of claim 1, wherein said levelers are polyamines and said brighteners are disulfides.

5. The method of claim 1, wherein said predetermined concentration of levelers is from about 1 ml/l to 10 ml/l and said predetermined concentration of brighteners is from about 2 ml/l to 20 ml/l.

6. The method of claim 1, wherein said predetermined thickness of said copper layer is from about 2,000 to 16,000 Å.

7. The method of claim 1, wherein said predetermined thickness of said copper layer is from about 7,000 to 9,000 Å.

8. The method of claim 1, wherein said applied voltage is from about 0.3 to 2.2 volts for a period of from about 0.1 to 5 seconds.

9. The method of claim 1, wherein said applied voltage is from about 0.5 to 2.0 volts for a period of from about 2 to 4 seconds.

10. The method of claim 1, wherein said applied voltage is from about 0.3 to 2 volts for a period of from about 0.1 to 5 seconds.

11. The method of claim 1, wherein said trenched semiconductor structure includes a barrier layer lining said semiconductor structure upper surface and said trench bottom and opposing lower and upper side walls.

12. The method of claim 1, wherein said trenched semiconductor structure includes a barrier layer and an overlying copper seed layer both lining said semiconductor structure upper surface and said trench bottom and opposing lower and upper side walls; said barrier layer being selected from the group titanium nitride, nitrided-titanium-tungsten, and tantalum nitride.

13. The method of claim 1, wherein the ratio of said trench width to depth is from about 1 to 10.

14. The method of claim 1, wherein the ratio of said trench width to depth is about 3.

15. A method for electroplating copper in a trench, the steps comprising:

providing a semiconductor structure and a trench formed therein; wherein said semiconductor structure is a substrate with an overlying interlevel metal dielectric layer having said trench, said interlevel metal dielectric layer having an upper surface, and said trench having a bottom, and lower and upper opposing side walls and further having a predetermined depth and width;

applying a voltage to said trenched semiconductor structure inducing a first field proximate said trench bottom, and a second field proximate said trench upper opposing side walls and said interlevel metal dielectric layer upper surface proximate said trench; said second field being greater than said first field creating a bias field;

immersing said semiconductor structure into an electroplating solution; said electroplating solution including a predetermined concentration of brighteners and a predetermined concentration of levelers; the concentration of said brighteners being greater proximate said trench bottom and the concentration of said levelers being greater proximate said trench upper opposing side walls and said interlevel metal dielectric layer upper surface proximate said trench;

depositing a copper layer having a predetermined thickness within said trench and blanket filling said interlevel metal dielectric layer upper surface; and planarizing said copper layer to form a planarized copper filled trench.

16. The method of claim 15, wherein said levelers are polyamines and said brighteners are disulfides.

17. The method of claim 15, wherein said predetermined concentration of levelers is from about 1 ml/l to 10 ml/l and said predetermined concentration of brighteners is from about 2 ml/l to 20 ml/l.

18. The method of claim 15, wherein said applied voltage is from about 0.3 to 2.2 volts for a period of from about 0.1 to 5 seconds.

19. The method of claim 15, wherein said applied voltage is from about 0.5 to 2.0 volts for a period of from about 2 to 4 seconds.

20. The method of claim 15, wherein said applied voltage is from about 0.3 to 2 volts for a period of from about 0.1 to 5 seconds.

21. The method of claim 15, wherein said trenched semiconductor structure includes a barrier layer and an overlying copper seed layer both lining said semiconductor structure upper surface and said trench bottom and opposing lower and upper side walls; said barrier layer being selected from the group titanium nitride, nitrided-titanium-tungsten, and tantalum nitride.

* * * * *